(12) United States Patent
Haig et al.

(10) Patent No.: US 7,646,215 B2
(45) Date of Patent: Jan. 12, 2010

(54) EFFICIENT METHOD FOR IMPLEMENTING PROGRAMMABLE IMPEDANCE OUTPUT DRIVERS AND PROGRAMMABLE INPUT ON DIE TERMINATION ON A BI-DIRECTIONAL DATA BUS

(75) Inventors: Robert B. Haig, Austin, TX (US); Patrick T. Chuang, Cupertino, CA (US); Chih-Chiang Tseng, Fremont, CA (US); Kookhwan Kwon, San Ramon, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 12/079,100

(22) Filed: Mar. 24, 2008

(65) Prior Publication Data

US 2009/0237109 A1 Sep. 24, 2009

(51) Int. Cl.
*H03K 17/16* (2006.01)
*H03K 19/003* (2006.01)

(52) U.S. Cl. .............................. 326/30; 326/33; 326/34; 326/87

(58) Field of Classification Search .................. 326/30, 326/32–34, 87
See application file for complete search history.

(56) References Cited

U.S. PATENT DOCUMENTS

| 7,176,729 | B2 * | 2/2007 | Hayashi et al. | ............. 327/108 |
| 7,221,193 | B1 | 5/2007 | Wang et al. | |
| 2002/0172066 | A1 | 11/2002 | Mughal et al. | |
| 2003/0120847 | A1 | 6/2003 | Gasparik | |
| 2005/0088150 | A1 | 4/2005 | Hamanaka | |
| 2008/0079457 | A1 * | 4/2008 | Yuan | ........................... 326/30 |

OTHER PUBLICATIONS

Nam-Seong Kim et al., "Programmable and Automatically Adjustable On-Die Terminator for DDR3-SRAM interface", 2003 IEE Custom Integrated Circuits Conference, pp. 391-394, SRAM Design, Memory Division, Samsung Electronics Hwasung-City, Kyeonggi-Do, Korea.
Kevin Kilbuck, Use new DRAM advancements to push embedded systems performance higher, Automotive Design Line, hhtp://autimotivedesignline.com/howto/body electronics.

* cited by examiner

*Primary Examiner*—Anh Q Tran
(74) *Attorney, Agent, or Firm*—Haverstock & Owens LLP

(57) ABSTRACT

A combined input and termination circuit comprises a fixed portion of impedance and a programmable portion of impedance. The fixed portion is able to be fixed in a driver mode and a termination mode. The programmable portion is able to be configured to have a desired impedance in a driver mode or a termination mode while maintaining minimum associated capacitance.

19 Claims, 7 Drawing Sheets

EFFICIENT METHOD FOR IMPLEMENTING PROGRAMMABLE IMPEDANCE OUTPUT DRIVERS AND PROGRAMMABLE INPUT ON DIE TERMINATION ON A BI-DIRECTIONAL DATA BUS

FIELD OF THE INVENTION

The present invention relates to the field of input/output structures for integrated circuits. More specifically, the present invention relates to programmable input/output structures for implementing bi-directional data busses.

BACKGROUND OF THE INVENTION

Memory is an essential component to many electronic devices today, ranging from computers to televisions. In the past decade, common forms of memory have evolved from fast-page (FP) mode and extended data out (EDO) to SDR, DDR and DDR2, which has brought advanced architectures, faster speeds, higher densities and bandwidths, and lower supply voltages and power consumption. These significant advancements have combined to advance DRAM—and the computing market segments—to even higher performance levels.

In the year 2000, DDR SDRAM was introduced to the market. DDR technology doubles SDR data rate by transferring data on both the rising and falling edges of a clock cycle. With DDR, 2 bits per data line are transferred every clock cycle rather than the 1 bit per data line with SDR. To do this, 2 bits are accessed from the memory array for each data line on every clock cycle. This process is called 2-word or 2n-prefetch. Prefetch helps get speed at an evolutionary pace, improving yields and increasing performance. DDR2 SDRAM functions much like DDR SDRAM, but with new features that enable faster speeds. While DDR has a 2n-prefetch and DDR2 a 4n-prefetch, DDR3 has an 8n-prefetch. The internal data cycle time of DDR3 is one-eighth of the external clock rate, and the internal data bus width is 8 times the size of the external data bus width. With DDR3, 8 bits of data are moved from the memory array to the I/O buffer per data line on each core clock cycle. Other bandwidth-enhancing features include lower RTT (termination resistance) values to support higher data rates. DDR2 values start at 50 ohms, while DDR3 values start at 20 ohms. Because DDR3 has twice the bandwidth of DDR2, DDR3 speeds pick up where DDR2 leaves off. DDR3 speeds start at 800 Mbps and max out at 1,600 Mbps. When a 64 bit bus bandwidth is figured in, DDR3 can reach speeds of 6,400 to 12,800 Mtransfers/s. A similar evolution has occurred for SRAM.

FIG. 1 shows a top level block diagram of the interaction between a controller 110 and an SRAM 120. Generally, a controller 110 is electrically coupled to a Common Input/Output SRAM 120 (CIO SRAM) through a plurality of traces on a circuit board (not shown). A CIO SRAM is capable of both receiving and transmitting signals via the same input/output port. Such a configuration reduces both surface area of an integrated circuit and power consumption, which are the two greatest considerations in efficient circuit design. The controller 110 sends clock, address and control signals to the SRAM 120. In some embodiments, a data signal is bidirectional between the controller 110 and the SRAM 120. Alternatively, the Data signal is coupled from the SRAM 120 to elsewhere in the system and is independent of the controller.

FIG. 2 shows a Programmable Impedance Output Driver (PIOD) 200. Such a PIOD 200 is typically implemented by the SRAM to drive data output signals. The PIOD comprises at least one fixed pull-up device 210 which is electrically coupled to a power source VDDQ. The fixed pull-up device 210 is enabled when the SRAM drives an output signal "high." The PIOD further comprises at least one fixed pull-down device 215. The fixed pull-down device 215 is enabled when the SRAM drives an output signal "low." It will be apparent to those of ordinary skill in the art of integrated circuit design that a signal "high" is generally equal to the voltage VDDQ minus an appropriate gate to source voltage drop for a signal "high" or the voltage VSS plus a gate to source raise for a signal "low". Generally, the voltage VSS is ground, or zero. However, the voltage VSS is able to be a nonzero if the application requires. In this example, the fixed pull-up device 210 and fixed pull-down device 215 are both MOS transistors. The size of the fixed devices 210 and 215 is chosen such that when only one of the pull-up 210 or pull-down 215 devices are enabled the resulting driver impedance when measured from the output is greater than the maximum supported by the SRAM.

The PIOD 200 further comprises a bank of programmable pull-up devices 220 and a bank of programmable pull-down devices 230. Each device in the bank of programmable pull-up devices 220 is coupled to the voltage VDDQ and each device in the bank of programmable pull-down devices 230 is coupled to the voltage VSS. In the configuration described in FIG. 2, the pull-up devices 220 are binary weighted, meaning that the programmable pull-up device 220A is sized and configured to have a predetermined strength X, and each successive programmable pull-up device has a strength determined by X(2N) where N=1, 2, 3 and so on such that the device 220A has a strength of X, the device 220B has a strength of 2X, the device 220C has a strength of 4X, and so on. The bank of programmable pull-down devices 230 is configured in a similar fashion, such that device 230A has a strength of X, the device 230B has a strength of 2X, the device 230C has a strength of 4X, and so on. When an individual programmable pull-up device 220A-D or pull-down device 230A-D is enabled, the impedance value of that device is measurable from the output. Said differently, that impedance value is able to be measured from the output. The total size of all programmable devices is chosen such that when all of the fixed and programmable devices are enabled, the resulting driver impedance is less than or equal to the minimum supported the SRAM. Furthermore, the size of the smallest programmable device is chosen such that the ratio of its size to the total size of all fixed devices meets the driver impedance programming resolution accuracy target of the SRAM.

The output impedance of the PIOD 200 is able to be varied with a calibration circuitry 250 coupled to a reference impedance RQ 255. The reference impedance RQ 255 is typically an external resistor set by an end user as a reference point for the driver strength. When the various pull-up devices 220A-D or pull-down devices 230 A-D are enabled, the output impedance is an integer fraction or a multiple of RQ. Typically, and as a matter of convention, in high-speed synchronous SRAMs, the pull-up and pull-down driver impedance is equal to the value RQ/5. The typical range of driver impedance supported varies from 25Ω~35Ω (min) to 45Ω~60Ω (max). Generally, an output pre-driver 285 is used to buffer outgoing signals before transmission.

Similarly, the Programmable Input Termination (PIT) 300 shown in FIG. 3A has fixed pull-up devices 310 and fixed pull-down devices 315 along with a bank of variable pull-up devices 320 and pull-down devices 325. Termination impedance is able to be programmed any number of ways. Typically, an SRAM has a dedicated input pin (not shown) that the user connects to the voltage VSS through a reference resistor RT 321. The SRAM then uses a calibration circuit to determine which of the programmable pull-up devices to enable, in order for the resulting input "high" termination impedance to be equal to (or some specified fraction or multiple of) the termination impedance RT or which of the programmable pull-down fingers to enable, in order for the resulting input "low" termination impedance to be equal to (or some specified fraction or multiple of) the termination impedance RT. Typically, in high-speed synchronous SRAMs pull-up and pull-down termination impedance is equal to the termination impedance RT and the range of termination impedance supported varies from three to four times the range of driver impedance supported. In some applications, an input receiver 381 buffers signals for robust transmission within an integrated circuit.

FIG. 3B shows a separate driver and termination circuit 350. The circuit 350 comprises a driver portion 355 and a termination portion 360. The circuit 350 is able to be switched between driver and termination modes by external controls, thus saving space on a silicon chip. However, by essentially putting the two portions in series with an input/output point 370, all capacitances of all pull-up and pull-down devices are measurable from the input/output point 370, causing an overall detrimental effect on the maximum data transfer rate achievable.

An improvement over the solution of FIG. 3B is shown in FIG. 3C. A common output driver and input termination circuit 380 comprises a fixed portion 381 and a programmable portion 382. In this example, the output driver impedance range supported is between 25Ω and 50Ω. As mentioned above, the reference impedance RQ is usually five times greater than the supported range, or 125Ω to 250Ω. The input termination impedance range needed to be supported is approximately 120Ω~180Ω and the termination impedance RT is 120Ω~180Ω. The same circuit is duplicated to calibrate output driver strength and input termination strength. The circuit calibrates an impedance range equal to the union of the reference impedance RQ and the termination impedance RT ranges (120Ω~250Ω). Therefore, the effective termination impedance range supported (120Ω~250Ω) is 5 times the effective driver impedance range supported (24Ω~50Ω). It is important to note that for the input termination, this solution offers a far greater range than is actually needed. The greater and unnecessary range directly correlates to a greater capacitance measurable from the input/output which has detrimental effects on the fastest possible data transfer. The reason for the excess range comes from the topography. The circuit 383 comprises one fixed pull-up device 383A and pull-down device 383B along with six programmable, binary-weighted pull-up and pull-down devices, and produces 6-bit binary pull-up and pull-down enable codes. The size of the fixed devices 381A and 381B in the fixed portion 381 is determined by the size of the fixed devices 383A and 383B in the impedance calibration circuit. The fixed devices 381A and 381B are enabled when the circuit 380 is functioning as an output driver only. The programmable portion 382 of the combined output driver input termination comprises nine binary weighted pull-up and pull-down devices 382A-I. The size of these programmable devices is determined by the size of the programmable devices used in the impedance calibration circuit 383. The six bit pull-up and pull-down enable codes produced by the driver impedance calibration circuit are applied directly to the six largest programmable devices (the 6 MSB devices) to best correlate the impedance of the driver to an external termination RQ. A 4-bit binary code (specifically, "1100") equal to the relative strength of the fixed devices used in the impedance calibration circuit is added to the 6-bit pull-up and pull-down enable codes produced by the termination impedance calibration circuit. The sum is then divided by 5, since the effective termination strength range is 5 times the effective driver strength range and the 7 most significant digits of the result were then applied to the 7 smallest programmable devices, to create the input termination. In this way, the programmable devices are used to create both the programmable and fixed portions of the input termination. In effect, in termination mode, the fixed impedance portion is rolled into the programmable portion.

While the total Input/Output capacitance of this common solution was less than it would have been had a separate solution been used, it is not minimized. Also, dividing the six bit pull-up and pull-down enable codes produced by the termination impedance calibration circuit 383 by five before applying them to the appropriate programmable pull-up and pull-down devices, degrades the programming resolution accuracy of the termination impedance, because the result of the division is rounded and rounding introduces additional error in the accuracy of the impedance.

SUMMARY OF THE INVENTION

A combined programmable input and output having a driver impedance and a termination impedance for an integrated circuit comprises a fixed portion having a fixed impedance, a programmable portion having a programmable impedance comprising a plurality of pull-up devices and an equal plurality of pull-down devices coupled to the fixed portion, a first circuit for determining the driver impedance as measured from a combined input/output port and a second circuit for determining the termination impedance as measured from the combined input/output port. Preferably, the pull-up and pull-down devices comprise transistors.

To effectuate use as a combined driver/termination device, the fixed portion is able to have a fixed impedance in a driver mode and a fixed impedance in a termination mode. For achieving desired driver and termination strengths, the first and second circuits comprise means for transmitting enable codes to the programmable portion. In some embodiments, the means for transmitting enable codes comprises a plurality of pull-up and pull-down devices for forming the enable codes. Preferably, the plurality of pull-up devices and the plurality of pull-down devices are binary weighted, having a pull-up device of highest impedance, a pull-up device of lowest impedance, a pull-down device of highest impedance, and a pull-down device of lowest impedance. However, other methods of weighting such as gray scale or a proprietary weighting are envisioned. Generally, the impedances of the fixed and programmable portions are referenced to at least one external resistive element.

In one aspect of the programmable input and output device, the driver impedance is derived from the termination impedance. In such an embodiment, the plurality of pull-up and pull-down devices are weighted in some manner, such as binary weighting, as mentioned above. To effectuate a stronger driver impedance than a termination impedance, the common driver/termination circuit comprises more pull-up and pull-down devices, wherein these pull-up and pull-down devices have strengths that are greater than the strongest pull-up and pull-down devices. For example, if the termination is comprised of six fingers having the strengths Y, 2Y, 4Y, 8Y, 16Y, 32Y, the seventh and eighth pull-up and pull-down devices are at least 64Y, thereby effectuating a stronger driver. The enable codes formed by the first circuit for determining a driver strength are applied to the MSB devices. For example, if the first circuit forms a 7-bit enable code, the code is applied to the pull-up and pull-down devices having strengths of 64Y, 64Y, 32Y, 16Y, 8Y, 4Y and 2Y. The enable codes formed by the second circuit for determining a termination strength are applied to the LSB devices. For example, if the second circuit forms a 6-bit enable code, the code is applied to the pull-up and pull-down devices having strengths of 32Y, 16Y, 8Y, 4Y, 2Y and Y. For the broadest range of possible impedances, the fixed portion comprises a first pull-up device having a strength that is greater than the smallest pull-up device in the second portion and a first pull-down device having a strength that is greater than the strength of the smallest pull-down device. The ratio of size from the first pull-up and first pull-down devices to the smallest programmable devices is determined by the desired strength accuracy. For example, a ratio of thirty to one results in an accuracy of approximately ±1.6%. To effectuate toggling between a termination mode and a driver mode, the first portion further comprises a second pull-up device having a strength that is larger the first pull-up device and a second pull-down device that is larger the strength of the first pull-down device. The ratio between the first and second pull-up and pull-down devices is determined by the desired ratio of driver strength and termination strength. For example, if the values of the larger of the pull-up and pull-down devices are twice the value of the smaller pull-up and pull-down devices, the driver strength will be three times the termination strength.

In one aspect of the programmable input and output device, the termination impedance is derived from the driver impedance. In such an embodiment, the plurality of pull-up and pull-down devices are weighted in some manner, such as binary weighting, as mentioned above. To effectuate a weaker termination strength than a driver strength while maintaining an acceptable impedance resolution accuracy, the common driver/termination circuit comprises more pull-up devices and pull-down devices, wherein these pull-up and pull-down devices have strengths that are less than the weakest pull-up and pull-down devices. For example, if the driver is comprised of six fingers having strengths of X, 2X, 4X, 8X, 16X and 32X, the additional fingers have strengths of X/2 and X/4. The enable codes formed by the first circuit for determining a driver impedance are applied to the MSB devices. For example, if the first circuit forms a 6-bit enable code, the code is applied to the pull-up and pull-down devices having strengths of 32X, 16X, 8X, 4X, 2X, and X. The enable codes formed by the second circuit for determining a termination strength are applied to the LSB devices. For example, if the second circuit forms a 7-bit enable code, the code is applied to the pull-up and pull-down devices having strengths of 16X, 8X, 4X, 2X, X, X/2 and X/4. For the broadest range of possible impedances, the fixed portion comprises a first pull-up device having a strength that is greater than the smallest pull-up device in the second portion and a first pull-down device having a strength that is greater than the strength of the smallest pull-down device. The ratio of size from the first pull-up and first pull-down devices to the smallest programmable devices is determined by the desired impedance accuracy. For example, a ratio of thirty to one results in an accuracy of approximately ±1.6%. To effectuate toggling between a termination mode and a driver mode, the first portion further comprises a second pull-up device having a strength that is larger the first pull-up device and a second pull-down device that is larger the impedance of the first pull-down device. The ratio of impedances between the first and second pull-up and pull-down devices is determined by the desired ratio of driver strength and termination strength. For example, if the values of the larger of the pull-up and pull-down devices are twice the value of the smaller pull-up and pull-down devices, the driver strength will be three times the termination strength.

In another aspect of the invention, a method for setting an optimum impedance having a minimum capacitance for a common input termination and output driver circuit comprises setting one of a driver mode and a termination mode by selectively coupling at least one of two pull-up devices and at least one of two pull-down devices into a data I/O path such that its impedance is measurable from a Data I/O port; and if set in a driver mode, setting a driver impedance to correspond to a desired driver impedance by selectively coupling at least one of a plurality of pull-up devices or at least one of a plurality of pull-down devices into a data I/O path such that its impedance is measurable from a data I/O port; and if set in a termination mode, setting a termination impedance to a desired termination impedance by selectively coupling at least one of the plurality of pull-up device and at least one of the plurality of pull-down into a data I/O path such that its impedance is measurable from a data I/O port. Preferably, setting a driver impedance comprises sending an N-bit enable to code to N programmable pull-up devices and N programmable pull-down devices in a programmable portion of the common input termination and output driver circuit and setting a termination impedance comprises sending an M-bit enable to code to M programmable pull-up devices and M programmable pull-down devices in a programmable portion of the common input termination and output driver circuit. In some embodiments, the plurality of pull and pull down devices are binary weighted such that there is a pull-up device, and pull-down device having least impedance corresponding to greatest strength, and a pull-up device and a pull-down device having greatest impedance corresponding to least strength. In some embodiments, at least one of the fixed pull-up devices has a strength that is greater than the strength of the weakest programmable pull-up device by a predetermined ratio, and at least one of the fixed pull-down devices has a strength that is greater than the strength of the weakest programmable pull-down device by the predetermined ratio; wherein the ratio is predetermined based on a desired impedance accuracy.

DETAILED DESCRIPTION OF THE PREFERRED EMBODIMENT

Methods and apparatuses directed to input/output buffers and controls for integrated circuits are described herein. In general, input/output structures for SRAMs are envisioned. In this specification and claims, the term "SRAM" is used to refer to a static random access memory device that is used to latch address, control and write data signals driven into the SRAM and control the output timing of read data signals driven from the SRAM. "Controller" is used to refer to any component, such as an ASIC, FPGA or similar device used to access the SRAM. The controller initiates write operations to store data in the SRAM, and read operations to retrieve data from the SRAM. Other embodiments of the present invention will readily suggest themselves to people skilled in the relevant arts. Other embodiments, although time consuming to discover, would nonetheless be a routine engineering effort to such skilled people having the benefit of this disclosure. In the example given herein, the pull-up and pull-down devices are MOS transistors. Although MOS transistors and CMOS transistor pairs are generally described, alternative configurations, including but not limited to passive resistors, complimentary bipolar pairs, complimentary DMOS pairs, complimentary FET pairs and other active devices are also contemplated. Such alternative configurations each have advantageous and disadvantageous characteristics that a skilled integrated circuit designer will take into account when applying the teachings of this disclosure to a specific application. It is well known that a transistor's impedance is inversely proportional to its physical size. A device's size is relevant to the teachings herein only to the extent that they correspond with a device's strength. For clarity, as used herein, "stronger" devices refer to devices having less impedance. Said differently, a device's "strength" is inversely proportional to its actual measured impedance.

Reference will now be made in detail to implementations of the present invention as illustrated in the accompanying drawings. The drawings may not be to scale. The same reference indicators will be used throughout the drawings and the following detailed description to refer to identical or like elements. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort will be a routine undertaking of engineering for those of ordinary skill in the art having the benefit of this disclosure.

Figure 4:
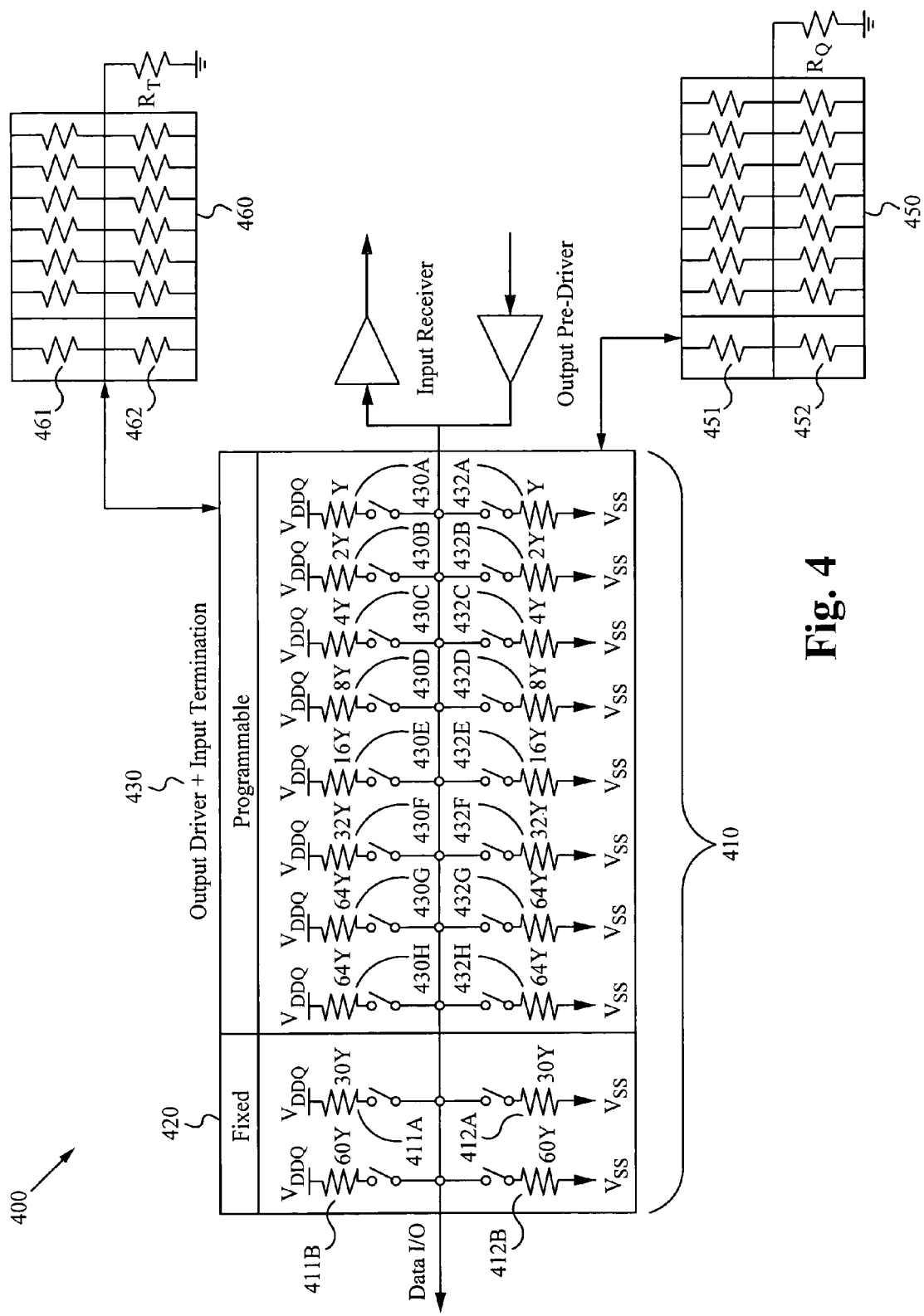
FIG. 4 shows the combined programmable impedance output driver and input termination of the current disclosure.

FIG. 4 shows an embodiment of a programmable common I/O system 400 that minimizes capacitance without sacrificing programming resolution accuracy. In this embodiment, the input termination is used as the basis from which the output driver is derived. To achieve this, two separate and distinct circuits are used to calibrate output driver impedance and input termination impedance. The first circuit 460 is a termination impedance calibration circuit which comprises one fixed pull-up device 461 and pull-down device 462. The first circuit 460 also comprises N programmable, binary weighted pull-up and pull-down devices, and produces an N bit binary pull-up and pull-down enable code. In this example, N=6. The second circuit 450 is a driver impedance calibration circuit which comprises one fixed pull-up 451 and pull-down device 452, plus M programmable, binary-weighted pull-up and pull-down devices, and produces an M binary pull-up and pull-down enable codes. In this example, M=7.

The programmable common I/O system 400 further comprises a combined output driver/input termination circuit 410, having a fixed portion 420 and a programmable portion 430. The fixed portion 410 of the combined output driver/input termination 410 comprises two pull-up devices 411 and pull-down devices 412. In the exemplary embodiment of FIG. 4, the strength of the first fixed pull-up device 411A is one half of the strength of the second pull-up device 411B. Similarly, the strength of the first fixed pull-down device 412A is one half of the strength of the second pull-down device 412B. The size of the smaller fixed devices 411A and 412A is determined by the size of the fixed devices 461 and 462 in the termination impedance calibration circuit 460. The size of the larger fixed devices 411B and 412B is determined by the difference in the sizes of the fixed devices 451 and 452 used in the driver impedance calibration circuit and those used in the termination impedance calibration circuit. When the system 400 is being used as a driver, all of the fixed devices are enabled, meaning their impedance is measurable by the data I/O. When the system 400 is being used as an input termination, only the smaller fixed devices 411A and 412A are enabled. The ratio of sizes between the larger fixed devices 411B, 412B and the smaller devices 411A, 412A is determined by the desired impedance ratio between the driver and termination mode. As will be made evident below, a ratio of 2:1 in strength as shown in FIG. 4 will result in a ratio of 3:1 in termination strength to driver strength. As mentioned above, this results in a driver that is three times "stronger" than the termination.

The programmable portion 430 of the combined output driver/input termination 410 comprises eight binary weighted pull-up devices 430A-430H and eight binary weighted pull-down devices 432A-432H. The size of these programmable devices is determined by the size of the programmable devices used in the termination impedance calibration circuit 460. A total of eight programmable devices are implemented because the termination impedance range is typically greater than two times but less than or equal to four times the driver impedance range. As mentioned above, the range is determined by convention in the industry, and it will be apparent that slight modifications are able to be made for tailoring impedances, and thereby the drive and termination strengths, to many applications. To that end, two MSB devices, in this example 64Y, are implemented in addition to the six LSB devices used for input termination in order to support the driver impedance range. As a result, the input termination impedance range is three times greater than the driver impedance range. When the system 400 is in input termination mode, the six bit pull-up and pull-down enable codes produced by the termination impedance calibration circuit 460 are applied directly to the six smallest programmable pull-up devices 430A-430F. When the system 400 is in output driver mode, the seven bit pull-up and pull-down enable codes produced by the driver impedance calibration circuit 450 are applied directly to the seven largest programmable pull-up devices 430C-430H, to create the output drivers. The end result is a programmable common output driver and input termination structure 410 having minimum capacitance that is able to be optimized on the fly for use as both an output driver having a range of supported impedances from 35Ω to 45Ω where the reference impedance RQ is between 175Ω and 225Ω. The structure 410 also supports an input termination impedance range of 105Ω to 135Ω where the termination impedance RT is between 105Ω and 135Ω.

In this exemplary embodiment, the size of the smallest devices 430A used for the programmable portion 430 of the combined device 410 is 1/30th the strength of the devices 411A and 412A used for the fixed portion 420, equating to a termination impedance programming resolution accuracy of approximately ±1.7%. The size of the smallest devices used for the programmable portion of the output drivers is 1/45th the size of the devices used for the fixed portion of the output drivers. Equating to a driver impedance programming resolution accuracy of approximately ±1.1%. For output only signals such as output clocks, the same fixed devices and programmable devices (7) are able to be used to create the output driver. For input-only signals such as address control and input clocks, the same fixed devices (1) and programmable devices (6) are able to be used to create the input termination. No additional termination impedance calibration circuits are needed. Said differently, having at least two fixed devices in addition to the plurality of programmable devices allows a driver and input mode while minimizing capacitance since the second fixed device acts as a "baseline," or minimum strength so the minimum number of devices are integrated into the circuit to achieve the desired impedance ranges between driver and termination modes, meaning the overall capacitance is minimized.

It will be apparent to the skilled integrated circuit designer having the benefit of this disclosure that other driver and impedance ranges are readily achievable by manipulating the weights of the pull-up and pull-down devices in the programmable portion in FIG. 4 to achieve different multiples or fractions of the reference impedances RQ and the termination impedance RT. Also, the ratio of the sizes of the fixed devices 411A and 412A to the fixed devices 411B and 412B are able to be manipulated. By way of example, if in a particular application the termination impedance range is three times the driver impedance range then the larger fixed devices are two times the size of the smaller fixed devices. Therefore, the fixed devices enabled for the output drivers are three times the strength of those enabled for the input termination. As a result, the strength of the strongest programmable device is able to be reduced from "128Y" to "64Y", in order to further decrease the I/O capacitance because "64Y" is sufficient to support a driver impedance range that is one-third of the termination impedance range. In another exemplary application, if the termination impedance range is four times the driver impedance range, then the stronger fixed devices are three times the size of the weaker fixed devices, so that the fixed devices enabled for the output drivers are four times the strength of those enabled for the input termination. The strength of the strongest device is "128Y". Similar size and strength adjustments are able to be made for other ratios of termination impedance range to driver impedance range. Said differently, if the six LSB programmable devices are activated in a termination mode, the total strength is 63Y. In order to achieve a driver impedance at least three times stronger than the termination impedance, two more pull-up and pull-down devices having a strength at least equal to the total strength of the LSB devices are added, in this example 64Y and 64Y. To double the strength of the driver with respect to the termination, the first 64Y pull-up and pull-down devices are activated, making the total driver strength equal to 127Y. When the second 64Y pull-up and pull-down devices are activated, the total driver strength is 191Y, effectively triple the strength of the termination which is 63Y. If the desired driver strength is four times greater than the termination strength, the second pull-up and pull-down devices are equal to 128Y. When all devices are activated, the total driver strength is 255Y, effectively 4 times greater than the termination strength.

Figure 5:
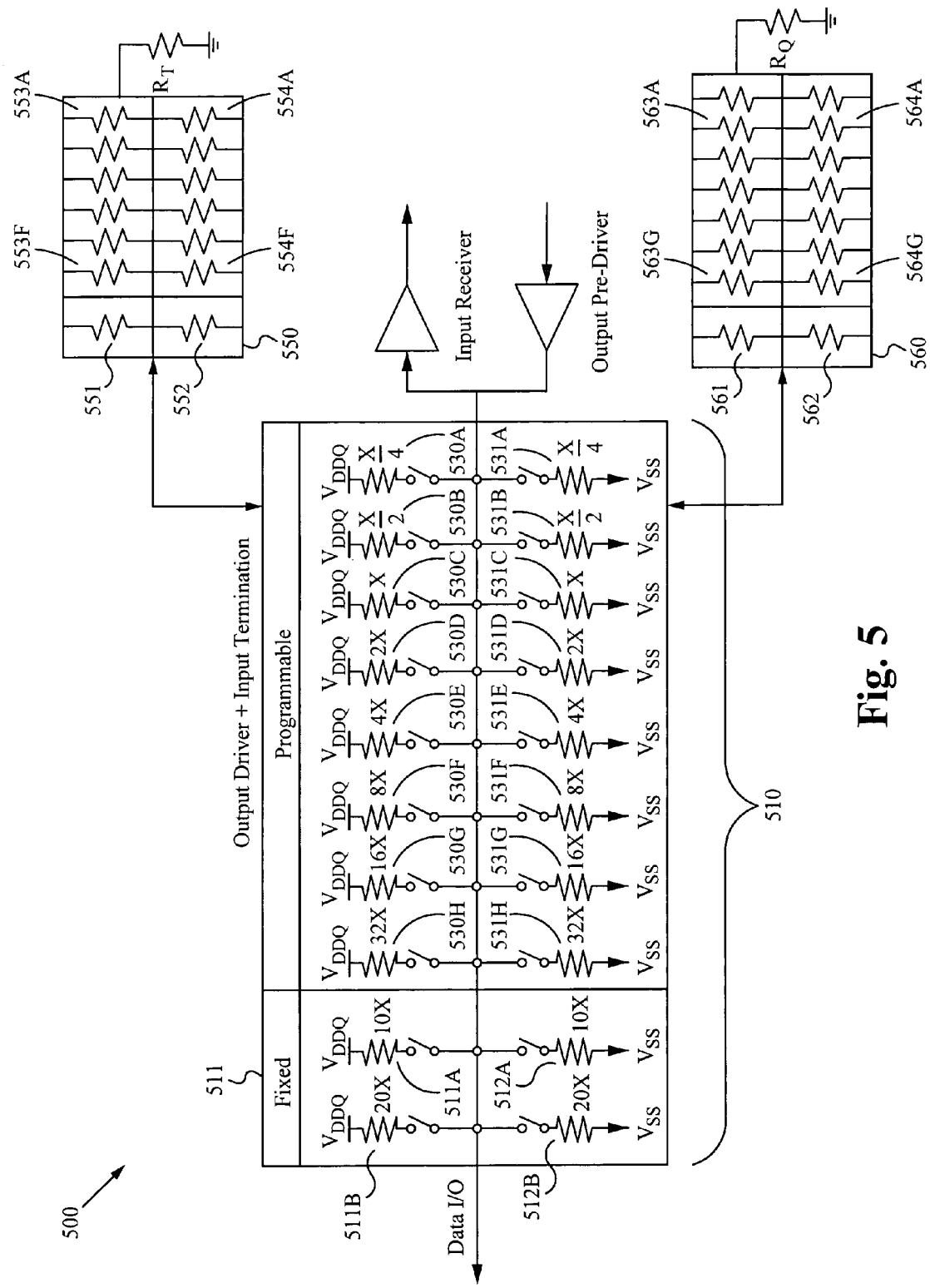
FIG. 5 shows an alternate embodiment of the combined programmable impedance output driver and input termination of the current disclosure.

FIG. 5 shows another embodiment of a programmable common driver and termination structure 500 that minimizes capacitance while maintaining desired ratios between a driver mode and a termination mode. Again, two distinct circuits are used to determine impedances of the structure 500: a first circuit 550 to determine the impedance when the structure 500 is being used as a driver and a second circuit 560 to determine the impedance when the structure 500 is being used as an input termination. The driver impedance determining circuit 550 comprises one fixed pull-up device 551 and one fixed pull-down device 552. The driver impedance determining circuit 550 further comprises six programmable binary weighted pull-up devices 553 A-F and six programmable binary weighted pull-down devices 554 A-F for producing 6-bit binary pull-up and pull-down enable codes. The termination impedance determining circuit 560 comprises one fixed pull-up device 561 and one fixed pull-down device 562. The termination impedance determining circuit 560 further comprises seven programmable binary weighted pull-up devices 563 A-G and seven programmable binary weighted pull-down devices 564 A-G for producing 7-bit binary pull-up and pull-down enable codes.

The programmable common driver and termination structure 500 further comprises a combined output driver/input termination 510. The fixed portion 511 of the combined output driver/input termination 510 comprises two pull-up devices 511A and 511B and two pull-down devices 512A and 512B. The size of the smaller fixed devices 511A and 511B is determined by the size of the fixed devices 561 and 562 used in the termination impedance calibration circuit 560. The size of the larger fixed devices 511B and 512B is determined by the difference in the sizes of the fixed devices 551 and 552 used in the driver impedance calibration circuit 550 and the fixed devices 561 and 562 used in the termination impedance calibration circuit 560. Similar to the embodiment shown in FIG. 4, the smaller fixed devices 511A and 512A are enabled when the combined driver output/input termination 510 is being used as an input termination and all fixed devices are enabled when the combined driver output/input termination 510 is being used as an output driver. Also similar to the embodiment in FIG. 4, the programmable portion 530 of the combined output driver/input termination 510 comprises eight binary weighted pull-up devices 530 A-H and eight binary weighted pull-down devices 531 A-H. In contrast to the embodiment in FIG. 4, the sizes of these programmable devices 530 A-H and 531 A-H are determined by the size of the programmable devices 553 A-F used in the driver impedance calibration circuit 550, rather than the input termination impedance calibration circuit 460 as in the embodiment of FIG. 4.

In some embodiments, eight programmable devices are implemented because as mentioned above, the termination impedance range is generally greater than two times but less than or equal to four times the driver impedance range. In this embodiment, two LSB devices are added to the six MSB devices used for the output drivers in order to support the termination impedance range. When the combined output driver/termination device 510 being used as an output driver, the 6-bit pull-up and pull-down enable codes produced by the driver impedance calibration circuit 550 are applied directly to the six strongest programmable devices 530 C-H to form the appropriate driver strength. When the combined output driver/termination device 510 being used as an input termination, the 7-bit pull-up and pull-down enable codes produced by the termination impedance calibration circuit 560 are applied directly to the seven weakest programmable devices 530 A-F to form the appropriate input termination impedance.

In the exemplary embodiment of FIG. 5, the strength of the smallest devices 530A used for the programmable portion 530 of the input termination is ¹⁄₄₀th the strength of the devices used for the fixed portion of the input termination, equating to a termination strength programming resolution accuracy of approximately ±1.3%. The strength of the weakest devices used for the programmable portion of the output drivers is ¹⁄₃₀th the strength of the devices used for the fixed portion of the output drivers, equating to a driver impedance programming resolution accuracy of ±1.7%. Stated differently, the two sets of devices in the fixed portion form a "minimum" strength in a driver mode and a termination mode. It will be apparent to a skilled circuit designer that the ratio in size between the pull-up and pull-down devices in the fixed portion having the least impedance and the pull-up and pull-down devices in the programmable portion having the least strength is determined by the desired impedance accuracy. For example, a larger ratio of impedance, such as 1:50, will result in a better impedance accuracy. In contrast to the embodiment of FIG. 4, the 6 MSB devices in FIG. 5 are sufficient to effectuate the impedance ranges in driver and termination mode. However, the smallest of the 6 MSB devices would then be X. In effect, the ratio between X and the weakest fixed device would be ⅒, meaning a resolution accuracy of only ±5%. Such a resolution accuracy is generally unacceptable, however specific applications tolerant of low resolution accuracy are contemplated within this disclosure. By including the weaker devices X/2 and X/4, the resolution accuracy is increased to ±1.25% while maintaining the desired impedance ratio between driver and termination mode.

Figure 1:
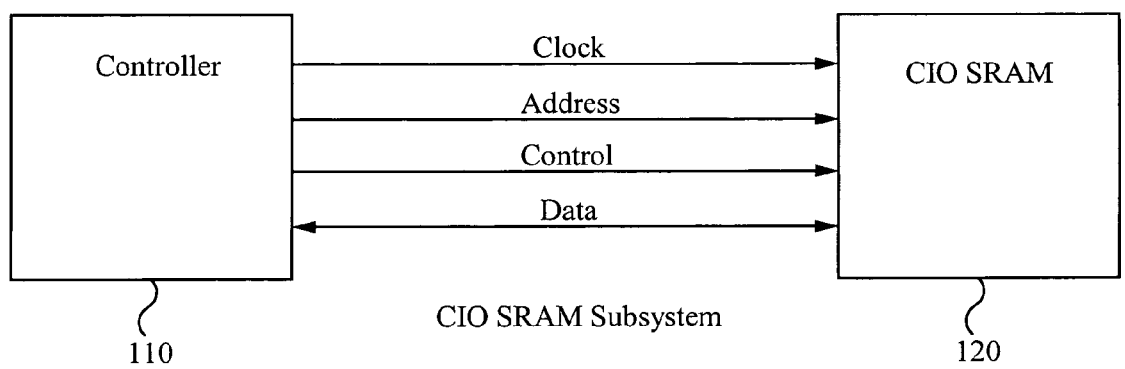
FIG. 1 shows a memory system, such as an SRAM.
Figure 2:
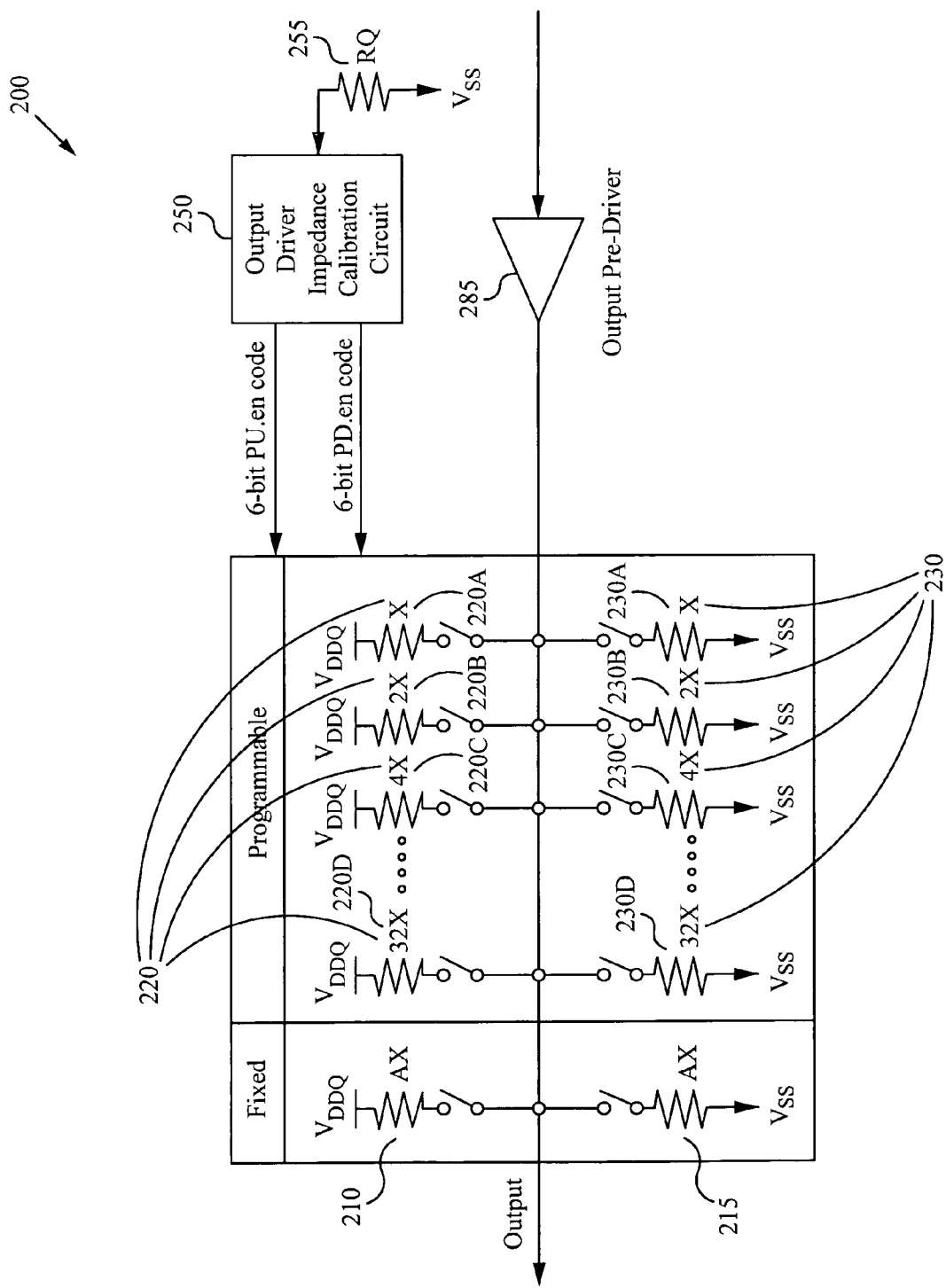
FIG. 2 shows a programmable impedance Output Driver.
Figure 3A:
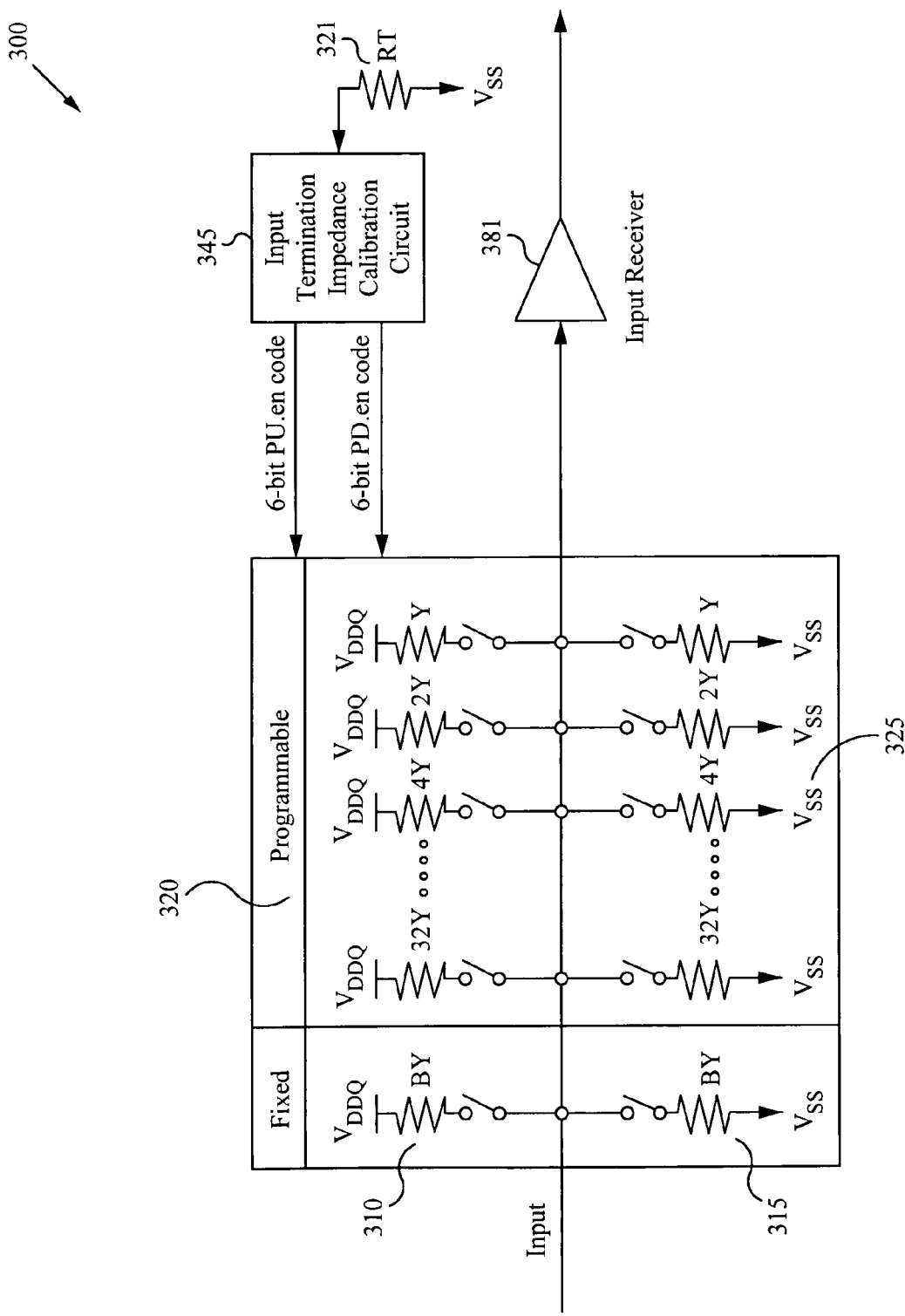
FIG. 3A shows a programmable termination circuit.
Figure 3B:
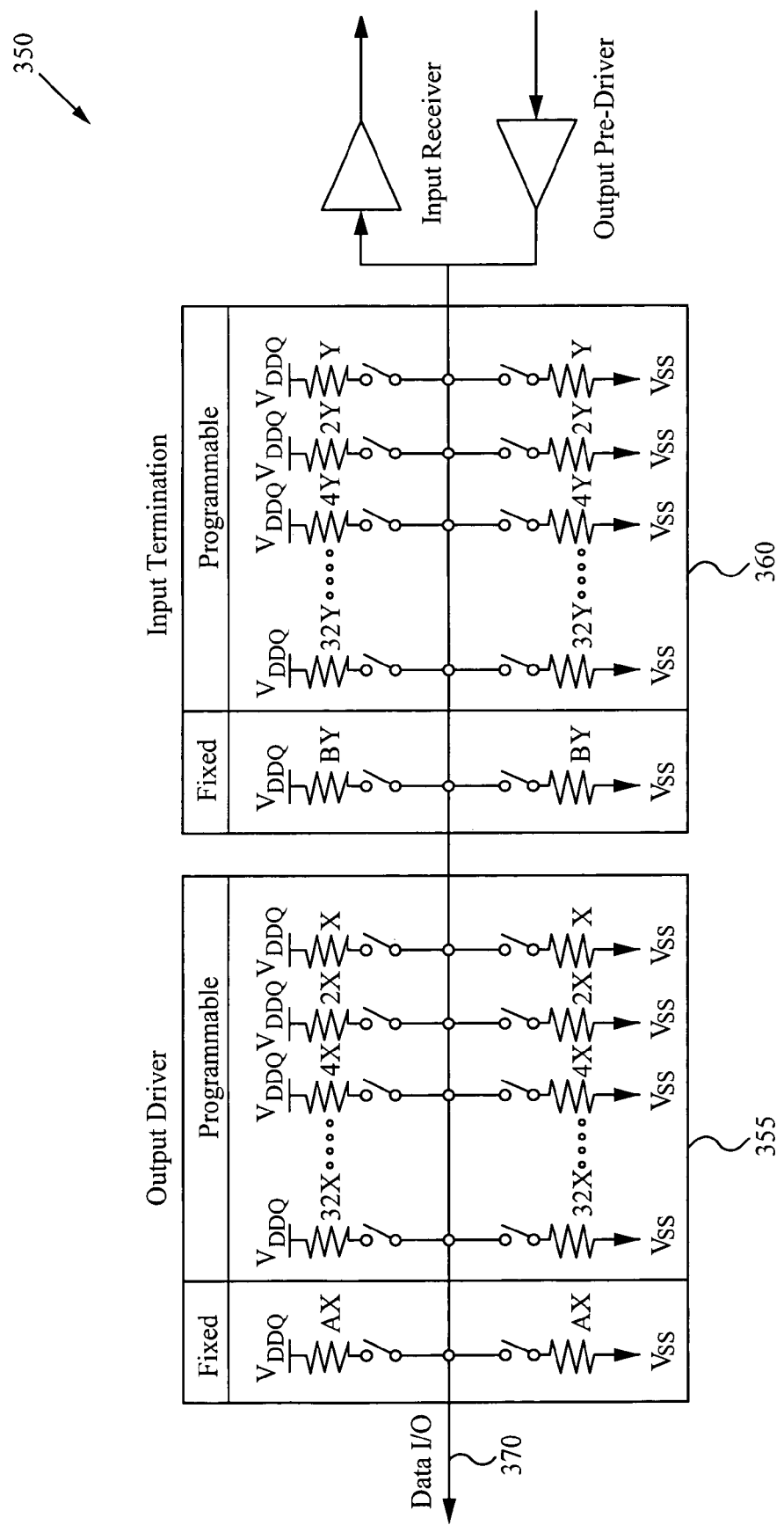
FIG. 3B shows a separate driver and termination circuit.
Figure 3C:
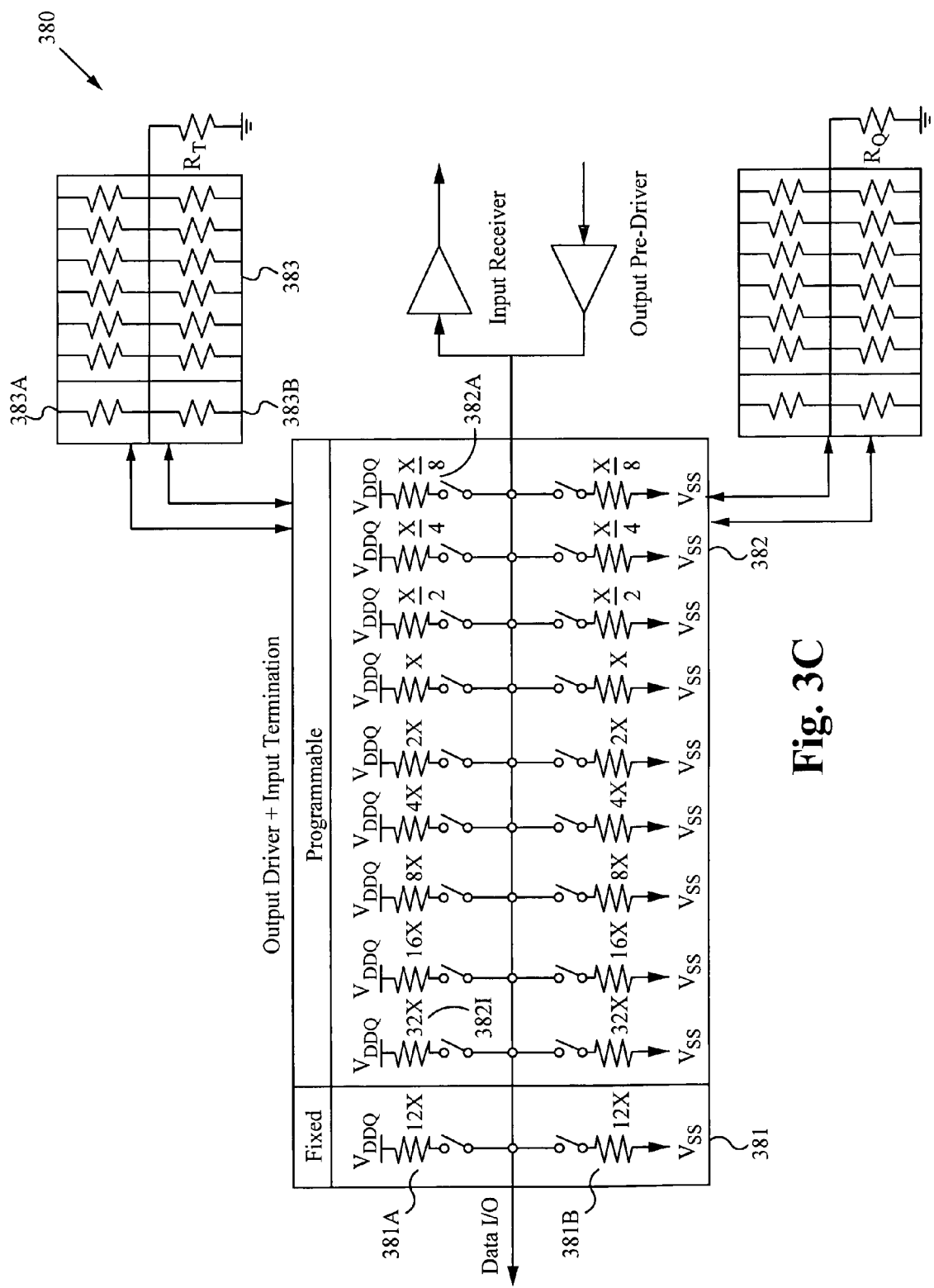
FIG. 3C shows a prior art combined programmable impedance output driver and input termination.

In operation, whatever impedance is determined to be optimum for either a driver or a termination mode will have minimum associated capacitance. The circuit that determines a driver impedance comprises a certain number of pull-up and pull-down devices N, and those devices form an N-bit enable code and control N of the programmable devices in the programmable portion of the common driver/termination circuit. Similarly, the circuit that determines the termination impedance comprises a certain number of pull-up and pull-down devices M, and those devices form an M-bit enable code to the programmable portion. As a result, the prior solution will always exhibit greater capacitance as measured from the Data I/O port, because there will be more devices total in the embodiments of FIGS. 3B and 3C to achieve the same impedance range as the embodiments described in FIGS. 4 and 5. It will be appreciated by those of ordinary skill that the pull-up and pull-down devices need not be activated in order to have a detrimental effect due to their capacitance. Just by virtue of being placed in the circuit, each device contributes parasitic capacitance. In the previous solution of FIG. 3C, 9 fingers (a pair comprising a pull-up and a pull-down device) are required to have the same impedance ratios as the embodiments shown in FIGS. 4 and 5, which each have 8 fingers, resulting in greater parasitic capacitance. The higher the overall capacitance, the lower the slew rate of the signal, since slew rate is inversely proportional to the capacitance perceived by the propagating signal. Although the decrease in slew rate is able to be countered with increased current supply, such an increase is generally not acceptable due to other detrimental effects of increased current, including increased overall power consumption, shortened battery life in portable devices, and circuit stability issues.

It well understood that the mass production of integrated circuits results in non uniform performance across all production lots. Generally, the variation of process parameters for a given process in a fabrication plant is known. When calculating the size of any device to perform a particular function or to exhibit a particular characteristic, the skilled designer will take such process variation into account.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. A combined programmable input and output having a driver impedance and a termination impedance for an integrated circuit comprising:
   a. a fixed portion having a fixed impedance;
   b. a programmable portion, having a programmable impedance, coupled to the fixed portion, comprising:
      i. a plurality of pull-up devices; and
      ii. an equal plurality of pull-down devices;
   c. a first circuit for determining the driver impedance as measured from a combined input/output port, the first circuit comprising N pull-up and N pull-down devices for forming enable codes for a driver impedance; and
   d. a second circuit for determining the termination impedance as measured from the combined input/output port, the second circuit comprising M pull-up and M pull-down devices for forming enable codes for a termination impedance;
   wherein M is not equal to N.

2. The combined programmable input and output of claim 1 wherein the N pull-up devices and N pull-down devices of the first circuit are coupled to N pull-up and N pull-down devices in the programmable portion to form a desired driver impedance, and the M pull-up and M pull-down devices of the second circuit are coupled to M pull-up and M pull-down devices in the programmable portion to form a desired termination impedance.

3. The combined programmable input and output of claim 1 wherein the plurality of pull-up and the plurality of pull-down devices in the programmable portion are weighted such that there is a pull-up and pull-down device of greatest strength, a pull-up and pull-down device of least strength, and a range of strengths.

4. The combined programmable input and output of claim 3 wherein the range of impedances is determined by a desired ratio of impedances between a driver mode and a termination mode.

5. A combined programmable input and output having a driver impedance and a termination impedance for an integrated circuit comprising:
   a. a fixed portion having a fixed impedance;
   b. a programmable portion, having a programmable impedance, coupled to the fixed portion, comprising:
      i. a plurality of pull-up devices; and
      ii. an equal plurality of pull-down devices;
      wherein the plurality of pull-up and the plurality of pull-down devices in the programmable portion are weighted such that there is a pull-up and pull-down device of greatest strength, a pull-up and pull-down device of least strength, and a range of strengths;
   c. a first circuit for determining the driver impedance as measure from a combined input/output port, wherein the first circuit comprises N pull-up and N pull-down devices for forming enable codes for a driver impedance; and
   d. a second circuit for determining the termination impedance as measured from the combined input/output port, wherein the second circuit comprises M pull-up and M pull-down devices for forming enable codes for a termination impedance;
wherein N pull-up and N pull-down devices are coupled to N pull-up and N pull-down devices in the programmable portion having greatest strength, and M pull-up and M pull-down devices are coupled to M pull-up and M-pull down devices in the programmable portion having the least strength.

6. The combined programmable input and output of claim 5 wherein the programmable portion further comprises two more pull up devices having a strength greater than a strongest pull up device and two more pull down devices having greater strength than a strongest pull down device.

7. The combined programmable input and output of claim 5 wherein the programmable portion further comprises two more pull up devices having a strength less than a weakest pull up device and two more pull down devices having less strength than a least pull down device.

8. The combined programmable input and output of claim 1 wherein the plurality of pull-up devices and the plurality of pull-down devices are binary weighted, having a pull-up device of highest strength, a pull-up device of lowest strength, a pull- down device of highest strength, and a pull-down device of lowest strength.

9. The combined programmable input and output of claim 8 wherein the impedance of the programmable portion is referenced to at least one external resistive element.

10. The combined programmable input and output of claim 8 wherein the impedance of the fixed portion is referenced to at least one external resistive element.

11. The combined programmable input and output of claim 8 wherein the fixed portion comprises a first pull-up, a first pull-down device, a second pull-up device and a second pull-down device, wherein the first pull-up and first pull-down device are larger than the second pull-up and second pull-down device by a pre-determined ratio.

12. The combined programmable input and output of claim 8 wherein the pre determined ratio is determined by a desired ratio of the driver impedance and the termination impedance.

13. The combined programmable input and output of claim 11 wherein the strength of the second pull-up device and second pull-down device is larger than a strength of a first pull-up device and a first pull-down device in the programmable portion by a pre-determined ratio.

14. The combined programmable input and output of claim 13 wherein the pre-determined ratio is determined by a desired impedance resolution accuracy.

15. A method for setting an optimum impedance having a minimum capacitance for a common input termination and output driver circuit comprising:
 a. setting one of a driver mode and a termination mode by selectively coupling at least one of two pull-up devices and at least one of two pull-down devices into a data I/O path such that its impedance is measurable from a data I/O port; and if set in a driver mode,
 b. setting a driver impedance to correspond to a desired driver impedance by selectively coupling at least one of a plurality of pull-up devices or at least one of a plurality of pull-down devices into a data I/O path such that its impedance is measurable from a data I/O port, wherein setting a driver impedance comprises sending an N-bit enable code to N programmable pull-up devices and N programmable pull-down devices in a programmable portion of the common input termination and output driver circuit; and if set in a termination mode,
 c. setting a termination impedance to a desired termination impedance by selectively coupling at least one of the plurality of pull-up device and at least one of the plurality of pull-down into a data I/O path such that its impedance is measurable from a data I/O port, wherein setting a termination impedance comprises sending an M-bit enable code to M programmable pull-up devices and M programmable pull-down devices in a programmable portion of the common input termination and output driver circuit;
 wherein M is not equal to N.

16. The method of claim 15 wherein setting a driver impedance referencing the driver impedance to an external resistive device.

17. The method of claim 15 wherein setting a termination comprises referencing the driver impedance to an external resistive device.

18. The method of claim 15 wherein the plurality of pull and pull down devices are binary weighted such that there is a pull-up device, and pull-down device having least strength, and a pull-up device and a pull-down device having greatest strength.

19. The method of claim 15 wherein at least one of the fixed pull-up devices has a strength that is greater than the strength of the weakest programmable pull-up device by a pre-determined ratio, and at least one of the fixed pull-down devices has a strength that is greater than the strength of the weakest programmable pull-down device by the predetermined ratio; wherein the ratio is predetermined based on a desired impedance accuracy.

* * * * *